United States Patent [19]

Levi

[11] Patent Number: 4,829,343
[45] Date of Patent: May 9, 1989

[54] HOT ELECTRON TRANSISTOR

[75] Inventor: Anthony F. J. Levi, Millburn, N.J.

[73] Assignee: American Telephone & Telegraph Company, AT&T Bell Laboratories, Murray Hill, N.J.

[21] Appl. No.: 74,127

[22] Filed: Jul. 17, 1987

[51] Int. Cl.$^4$ ............................................. H01L 27/12
[52] U.S. Cl. .......................................... 357/4; 357/16; 357/61
[58] Field of Search ....................... 357/4 SL, 4, 16, 61

[56] References Cited

U.S. PATENT DOCUMENTS

| 4,649,405 | 3/1987 | Eastman | 357/16 X |
| 4,670,767 | 6/1987 | Ohta | 357/16 X |
| 4,672,404 | 6/1987 | Ankri et al. | 357/16 X |
| 4,712,219 | 12/1987 | Yano | 357/16 X |

OTHER PUBLICATIONS

*IEEE Spectrum*, "The Quest for Ballistic Action", by T. E. Bell, Feb., 1986, pp. 36–38.
*IEEE Spectrum*, "Ballistic Electrons in Compound Semiconductors", Feb., 1986, pp. 42–45.
*Physical Review Letters*, vol. 55(19), "Injected-Hot-Electron Transport in GaAs", by A. F. J. Levi et al., pp. 2071–2073, Nov. 4, 1985.
*Physical Review Letters*, vol. 55(20), "Direct Observation of Ballistic Transport in GaAs", Nov. 11, 1985, pp. 2200–2203, M. Heiblum et al.
*IEEE Spectrum*, "A Gallium Arsenide Ballistic Transistor", by M. I. Nathan et al., Feb., 1986, pp. 45–47.
*Electronics Letters*, vol. 20(21), "Hot Electron Spectroscopy", by J. R. Hayes et al., pp. 851–852, Aug., 1984.
*IEEE Proceedings*, vol. 128(9), "Calculated Performance of Monolithic Hot-Electron Transistors", Aug., 1981, pp. 134–140.
*Solid State Electronics*, vol. 24, "Tunneling Hot Electron Transfer Amplifiers (THETA): Amplifiers Operating Up to the Infrared", (1981), pp. 343–366.

Primary Examiner—Martin H. Edlow
Attorney, Agent, or Firm—Eugen E. Pacher

[57] ABSTRACT

An improved compound semiconductor hot electron transistor (HET) having room temperature current gain $\beta > 10$ is disclosed. Disclosed are also means by which improved HET performance can be obtained. Among these means is choice of the base layer material such that the hot electrons injected into the base have $k_{i,2}/k_{i,1} > 0.2$, where $k_{i,1}$ and $k_{i,2}$ are the components of the electron wave vector respectively normal and parallel to the emitter/base interface. A further means is choice of collector material such that the hot electron velocity component normal to the base/collector interface remains relatively unchanged upon passage of the hot electron through the base/collector interface. For instance, an appropriate superlattice in the collector region may be used to achieve such matching. Causing quantization of the ambient charge carrier states in the base can reduce hot electron scattering in the base. In bipolar HETs such scattering can also be reduced if the effective heavy hole mass in the base is much larger (e.g., ×10) than the effective electron mass in the forward direction. A strained base layer may be used to achieve this.

13 Claims, 3 Drawing Sheets

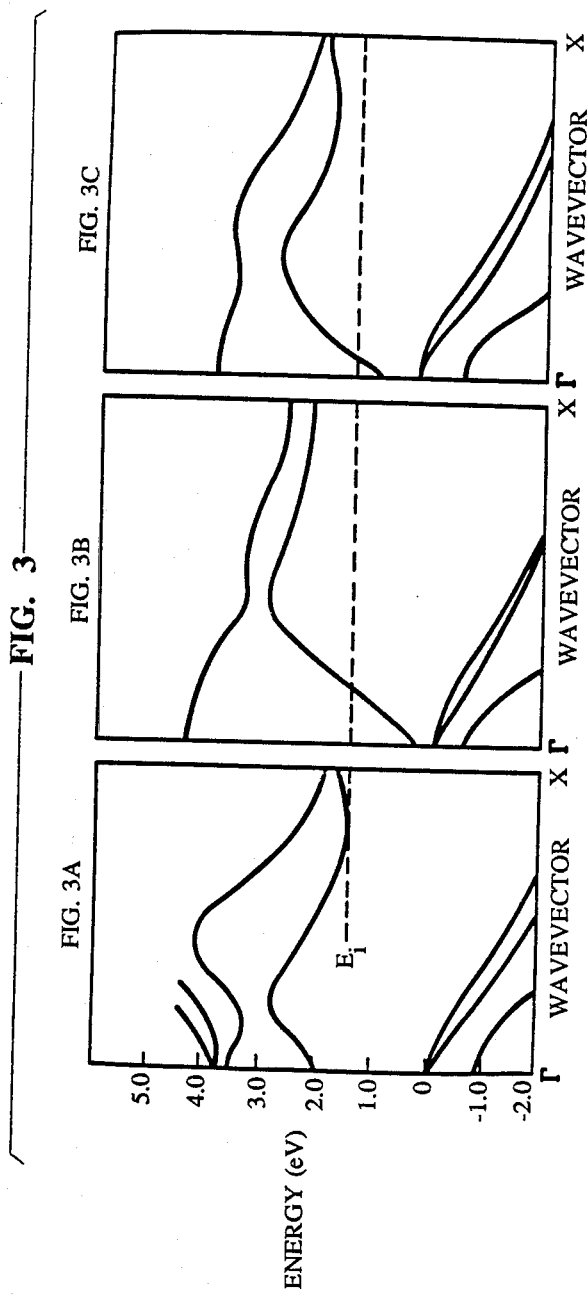

HOT ELECTRON TRANSISTOR

FIELD OF THE INVENTION

This application pertains to the field of active semiconductor devices. In particular, it pertains to transistors in which a substantial fraction of the current is carried by hot elecrtons, including ballistic electrons.

BACKGROUND OF THE INVENTION

It has been known for some time that a hot electron transistor, especially a ballistic transistor, could potentially be operated at frequencies in excess of those achievable with conventional (diffusive) transistors. See, for instance, T. E. Bell, *IEEE Spectrum*, February, 1986, pp. 36–38, incorporated herein by reference. Various types of hot electron transistors (HET) have been proposed. This application is concerned with one particular class of HETs, namely, compound semiconductor HETs. For a brief review, see L. F. Eastman, ibid, pp. 42–45, also incorporated herein by reference.

Essentially all the prior art work on compound semiconductor HETs has been concerned with GaAs-based devices, and recently ballistic transport has indeed been observed in GaAs-based research devices. A. F. J. Levi et al, *Physical Review Letters*, Vol. 55(19), pp. 2071–2073; M. Heiblum et al, *Physical Review Letters*, Vol. 55(20), pp. 2200–2203 and M. I. Nathan et al, *IEEE Spectrum*, February 1986, pp. 45–47.

The ballistic transport was observed in devices having geometries that are thought to hold promise for implementation as a practical HET. The first type, frequently referred to as a planar doped barrier transistor (PDBT, see for instance, J. R. Hayes et al *Electronic Letters*, Vol. 20(21), pp. 851–852 or "camel" transistor, J. M. Shannon, *IEEE Proceedings*, Vol. 128(9), pp. 134–140 (1981), both incorporated herein by reference) uses thermionic injection and comprises emitter, base, and collector, with an appropriately shaped potential barrier between emitter and base, and a second barrier between base and collector. The second type, which is referred to as a tunneling hot electron transfer amplifier (THETA, see for instance, M. Heiblum, *Solid State Electronics*, Vol. 24, pp. 343–366) differs from the first type in having tunnel injection into the base. Both of the above types are unipolar; however, bipolar HETs have also been proposed in GaAs/AlGaAs.

The flow of electrons from emitter to base is controlled in both types by varying the emitter/base barrier potential by means of an applied voltage $V_{eb}$. Similarly, the flow of electrons from the base to the collector can be controlled by means of an externally applied voltage $V_{bc}$ between base and collector. Under normal operating conditions, $V_{bc}$ reverse biases the base/collector junction. Electrons injected from the emitter into the base have energy substantially greater than the thermal energy of the ambient electrons in the base. These "hot" electrons ideally traverse the base without undergoing significant scattering. If the base/collector barrier is caused to be lower than the hot electron energy then some of the hot electrons can cross the barrier, be transmitted through the depletion region of the collector, and enter the sea of conduction electrons in the collector.

As will be readily understood by those skilled in the art, various difficulties have to be overcome before a device of this type can function as a practical HET. Among these difficulties is quantum mechanical reflection of the hot electrons by the base/collector barrier, and space charge limited current. Probably the greatest obstacle, however, is the difficulty of achieving substantially complete hot electron transport through the base, and, desirably, also through the depletion region of the collector.

A recently filed U.S. patent application Ser. No. 871,494, titled "Hot Electron Transistor", filed June 6, 1986 by J. R. Hayes et al), incorporated herein by reference, discloses means for achieving improved HETs. Among the means are use of a direct bandgap compound semiconductor material in the "transit" region of the HET, with the conduction electrons in the transit region material having relatively small effective mass, advantageously substantially smaller than the conduction electron effective mass in GaAs. Furthermore, the transit region comprises a compound semiconductor material in which the total scattering rate of the hot electrons is relatively small, advantageously substantially less than the scattering rate would be in GaAs of identical ambient electron resistivity. Exemplary of such materials are InAs, InSb, InGaAs, HgCdTl, and PbSnTe.

However, even though HETs that incorporate the teachings of the U.S. Ser. No. 871,494 patent application can attain performance levels that are substantially better than those obtainable with a GaAs-based HET of the same geometry, the performance levels are in many cases still inadequate for practical HETs. For instance, prior art HETs are generally incapable of producing substantial current gain (e.g., $\beta > 10$, where $\beta$ is the common emitter current gain) at room temperture (300 K.), and typically need to be operated at low temperatures (e.g. 77 K.).

In view of the operational simplification that results from the possibility of room temperature operation of a HET, and of the general desirability of improved characteristics such as $\beta$, means for achieving further improvements in HET characteristics would be of considerable significance. This application discloses such means.

DEFINITIONS

Electron transport in a crystal is herein defined to be "ballistic" if, in addition to its possible interaction with an accelerating electric field, the electron interacts substantially only with the static part of the lattice potential. Electron transport thus may be ballistic even though the electrons undergo some small angle scattering and/or small energy change.

A conduction electron herein is considered to be a "hot" electron in a given semiconductor region if its energy E is substantially greater than $E_F$, the Fermi energy in the region. Typically, $E > E_f + 10 k_B T$, where $k_B$ is the Boltzmann constant, and T is the absolute temperature of the lattice.

A "hot electron" transistor (HET) is a transistor whose operative characteristics are in substantial part determined by the transport of hot electrons through the transit region of the transistor, with minimal scattering of the hot electrons in the transit region.

The "transit region" of a HET herein is that portion of the HET through which substantial hot electron transport takes place, or is intended to take place. For instance, in a PDBT, camel transistor, or THETA device, the transit region consists of the base and the collector depletion region. In order to have the possibility of significant hot electron transport in a HET, the width of the transit region has to be less than the mean-free path of the hot electrons in the material.

The "ambient" charge carriers are those charge carriers (electrons or holes) that are essentially in thermal equilibrium with the lattice. For instance, in bipolar HETs the ambient charge carriers in the base typically are holes.

SUMMARY OF THE INVENTION

In a broad sense, I am herein teaching approaches that can be used to produce HETs of improved characteristics. For instance, the inventive approaches can result in compound semiconductor HETs hving substantial current gain (e.g., $\beta > 10$) at room temperature. Such transistors can be used in a variety of applications and likely will make possible apparatus operating at higher frequencies than is possible with prior art transistors.

HETs of inerest herein generally have geometries similar to those of prior art HETs. They comprise an electron emission region (the first region), an electron collection region (the third region), and a second region that is intermediate the first and third regions and forms interfaces therewith. The first region comprises an emitter layer, and the second region comprises a base layer, with typically the emitter layer contacting the base layer and forming the emitter/base interface therewith. The base layer is typically also in contact with third region material and forms the base/collector interface therewith. The first, second and third regions each generally consist of one or more layers of compound semiconductor material, with the composition of the base layer differing at least from that of the emitter layer. In some cases (e.g., in some bipolar HETs) the second region material may be basically the same as the third region material, with the second and third region materials containing different dopants and/or differing in dopant concentration.

HETs of interest herein also comprise means for making electrical contact with the first, second and third regions, respectively, and means for injecting hot electrons from the first into the second region. At least a substantial fraction (advantageously $>90\%$) of the injected hot electrons transit the second region without substantial energy loss and cross the base/collector interface. The injected hot electrons have average energy $E_i$, and their average velocity may be different in the different regions. Furthermore, with the injected hot electrons is associated a crystal momentum vector $k_i$ having a component $k_{i,1}$ perpendicular to, and a component $k_{i,2}$ parallel to, the emitter/base interface.

I have discovered that the characteristics of a HET can strongly depend on the materials used to construct the device. For instance, the emitter layer and the base layer advantageously consist of materials which have band structures such that the hot electrons injected into the base layer have trajectories that are substantially normal to the emitter/base interface, typically such that $k_{i,1}/k_{i,1}$ is less than about 0.2. This condition helps to ensure that a relatively large fraction of the injected electrons can transit the base layer without undergoing substantial scattering. Exemplarily, this condition can typically be met if the emitter layer comprises an indirect, wide bandgap material such as AlSbAs, the base layer comprises material (exemplarily InAs) that has a conduction band centered on the $\Gamma$-point in k-space (the terminology used to describe the band structure is conventional and well known to those skilled in the art), and the hot electrons are injected into these direct $\Gamma$-states.

Furthermore, the materials are most advantageously chosen such that the hot electron velocity component normal to the base/collector interface does not undergo substantial change upon crossing of that interface. This requires that the normal component of $\partial E_i/\partial k$ be substantially continuous (preferably changing by no more than about 20%) across the base/collector interface. In this expression $E_i$ is the average energy of the hot electrons, k is the electron wave vector, and $\partial$ signifies the partial derivative. The condition ensures that quantum mechanical reflection and resonances due to the presence of the interface are minimized. In order for more than about 90% of the hot electrons to be transmitted in the forward direction through the interface, the velocity component normal to the interface (for electrons of energy $E_i$) should typically change by at most about 11% upon crossing of the interface, and in preferred embodiments of the invention this condition will be met. GaSb and InAs are exemplary collector layer and base layer materials that can be advantageously be used in a HET according to the invention.

There are other means that can optionally be employed to improve the characteristics of a HET. For instance, ensuring quantization of the occupied ambient conduction electron in the base layer results in constraints on scattering and thus increases the probability that a hot electron can traverse the transit region ballistically. Such quantization results if at least one dimension of the base layer is very small, typically of the order of 10 mm. A very "thin" base layer that results in formation of a substantially 2-dimensional electron gas in the base layer introduces constraints on scattering, but a base layer that is not only thin but also narrow (and thus is substantially 1-dimensional) typically constrains scattering even further. Quantization of the ambient charge carriers in the base layer also increases the effective bandgap and thereby reduces the probability of interband scattering.

Incorporation of these and other features (to be discussed below) into a HET can result in a device having substantially improved performance, as compared to prior art devices. In particular, devices according to the invention can have room temperature $\beta > 10$ for a bias ($V_{ce}$) greater than about 1 volt.

BRIEF DESCRIPTION OF THE DRAWINGS

FIG. 3 schematically shows portions of the energy level diagrams of three materials useful in the practice of the invention.

DETAILED DESCRIPTION OF SOME PREFERRED EMBODIMENTS

Figure 1:
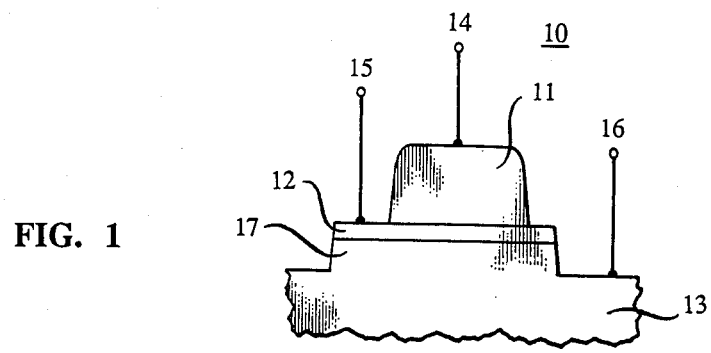
FIG. 1 schematically depicts a device according to the invention.

FIG. 1 schematically depicts a HET 10 according to the invention, wherein 11, 12 and 13 are the first, second, and third regions, respectively, and 14, 15, and 16 are means for making electrical contact to the first, second, and third regions, respectivley. It will be appreciated that in many cases the first, and third regions can be identified with emitter and collector respectively, and typically each comprise more than one layer, and that the second region comprises the base layer. Portion 17 of the third region is a collector depletion region. Exemplarily, 11 comprises $AlSb_{0.92}As_{0.08}$, 12 consists substantially of InAs, and 17 and 13 comprise GaSb. Exemplarily, the base layer is about 10 mm thick.

Figure 2:
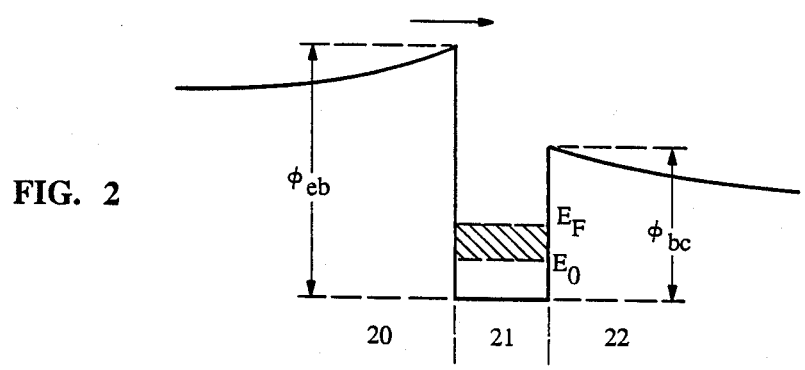
FIG. 2 shows schematically some features of the conduction band structure of a device according to the invention.

FIG. 2 shows schematically the conduction band of a double heterojunction HET according to the invention under bias, with numerals 20, 21, and 22 referring to the first region, the base, and the third region, respectively. The arrow indicates the direction of flow of hot electrons, $\phi_{eb}$ and $\phi_{bc}$ are the emitter/base and base/collector energy barriers, respectively (associated with the emitter/base and base/collector interfaces, respectively,) $E_o$ is the quantum-mechanical confinement energy (due to the 2-dimensional nature of the electron gas in 21), and $E_F$ is the Fermi energy in the second region. For the above referred to exemplary combination of materials, $\phi_{eb}$ can be about 1.3 eV, and $\phi_{bc}$ about 0.8 eV.

Currently preferred embodiments use thermionic emission to inject hot electrons of average energy $E_i$ from the emitter layer into the base layer. Space charging effects in the two barriers can be substantially avoided if the barrier regions are doped to a dopant density $\rho > j/ev$, where e is the electron charge, j is the current density, and v is the average electron valocity in the respective barrier. Reverse current flow from the base to the emitter layer can be minimized by choosing $\phi_{eb}$ and $\phi_{bc}$ to be substantially greater than the ambient thermal energy $k_B T$ ($k_B$ is the Boltzmann constant, and T is the absolute temperature). Typically $\phi_{bc} > 0.5$ eV for a room temperature HET.

The injection of hot electrons into the base is in general most efficient if both energy and momentum parallel to the emitter/base interface are conserved. Thus the emitter layer and base layer are advantageously chosen such that there are in the base layer empty states at energy $E_i$, and that associated with these empty states are wave vectors $k_i$ that have components $k_{i,2}$ that are substantially equal to the corresponding wave vector component of the electrons of energy $E_i$ in the emitter layer.

The above is schematically illustrated in FIGS. 3a and 3b, which show relevant portions of the band diagrams of exemplary emitter and base layer materials, respectively. As can be seen from FIG. 3a, electrons of energy close to $E_i$ have in this emitter material (exemplarily AlSb) wave vectors close to the X-point in the Brillouin zone and thus, in a (100) oriented device, there are electrons occupying X-point minima with small $k_{i,2}$ ($k_{i,2} << \pi/a$, and other X-point minima with large $k_{i,2}$ ($k_{i,2} \sim \pi/a$), where a is the lattice constant of the emitter layer material). Similarly, FIG. 3b shows that electrons of energy close to $E_i$ have in this base layer material (exemplarily InAs) wave vectors close to the Γ-point. This exemplary combination of emitter layer and base layer materials permits relatively efficient injection of hot electrons (of energy approximately equal to $E_i$) from the emitter layer into the base layer. In particular, the efficiently injected electrons are from the X-point minima with small $k_{i,2}$, which go into the small $k_{i,2}$, Γ-like states in the base layer material. Electrons from the other X-point minima cannot be efficiently injected because no empty states with large $k_{i,2}$ are available in the base layer material. Thus the injected electrons have only small velocity components parallel to the emitter/base interface, resulting in increased probability that the hot electrons can traverse the transit region ballistically.

A practical HET not only requires efficient injection of the hot electrons into the base but also substantially complete transmission of the hot electrons over the base/collector potential barrier. The probability that an electron is reflected at the base-collector interface decreases as the change of electron velocity upon entering the collector region decreases. Since the velocity is proportional to $\partial E/\partial k$, this suggests that advantageously the materials are selected such that $\partial E/\partial k_{Ei,2} \sim \partial E/\partial k_{E1,3}$, where the partial derivatives are to be taken at the average energy of the hot electrons, and subscripts 2 and 3 refer to the materials on either side of the base/collector interface.

An approximate alternative expression of the velocity matching condition, derived from effective mass theory and introduced for illustrative purposes only, in $m_2^*/m_3^* \sim E_i/(E_i - \phi_{bc})$, where $m_2^*$ and $m_3^*$ are the effective electron masses in the base and collector material, respectively. Thus, by careful choice of $E_i$, $\phi_{bc}$, base and collector materials (including the possible use of an appropriately designed superlattice in the collector depletion region), quantum reflections from $\phi_{bc}$ can be minimized. Typically, such matching is possible for a relatively small range of electron energies (exemplarily about 0.5 eV). Thus, it is advantageous to choose the emitter material and $\phi_{eb}$ such that the injected electrons have a relatively small energy spread.

Furthermore, high transmission through the base/collector interface typically requires that the electron wave function in the collector be similar in character to that in the base (e.g., both be s-like for electrons of energy $E_i$). For instance, the choice of InAs as base and GaSb as collector material makes possible satisfaction of both of the above matching conditions, as is illustrated by FIGS. 3b amd 3c, in which the latter shows the relevant portion of the band diagram of an exemplary collector material (exemplarily GaSb). At energy $E_i$ the electrons in both the base and the collector material are near the Γ-point in k-space and thus have s-like wavefunctions, and the slope of the conduction bands at $E_i$ are similar in the two materials.

There are further means that may optionally be used to improve the operating characteristics of a HET according to the invention. For instance, I have found that in a device having dimensions such that the base region comprises quantized electron states there exist kinematical constraints (due principally to energy and momentum conservation) that reduce the probability of electron-scattering below that in the bulk. Thus it is advantageous to reduce at least one dimension of the base region (typically its thickness) such that the ambient charge carriers in the base behave in the manner of a quasi 2-dimensional charge carrier gas. Typically, this requires that the thickness is less than about 50 nm, preferably less than about 20 nm. Further reduction in the effective dimensionality of the ambient charge carrier gas can further reduce the scattering probability. For instance, application of a magnetic field normal to the base layer can result in a reduction of hot electron scattering by a substantial amount, exemplarily a factor of 2-10. As will be appreciated by those skilled in the art, such a magnetic field can impose lateral confinement on the charge carrier motion, resulting in an effectively 0-dimensional charge carrier gas. An effectively 1-dimensional charge carrier gas can be produced by means of a thin and narrow (e.g., <50 nm) strip of base layer material.

It has also been found that electron scattering probabilities frequently depend strongly on the final state into which the electron is scattered. For instance, in InAs scattering of (100)-directed hot electrons into L-minima is typically less likely than into X-minima. Therefore, the injection energy $E_i$ is advantageously chosen to be less than the energy associated with the X-minima. On the other hand, it is not essential that $E_i$ is also less than the energy associated with the L-minima. This discovery obviously results in greater design freedom, while maintaining low scattering of the hot electrons.

In HETs with two classes of mobile charge carriers (e.g., bipolar HETs) it is frequently desirable that the effective heavy hole mass $m_h^*$ be much greater than $m_e^*$, the effective mass, since this also gives rise to kinematic constraints on scattering. For this effect to be significant, it is typically desirable that $m_h^*/m_e^* > 10$ perpendicular to the base/collector interface. Exemplarily, this condition can be met by use of a strained base layer.

It will be obvious to those skilled in the art that all three regions of an inventive device will consist of single crystal material, and that the base layer is epitaxial with the adjoining materials. Such structures can be grown by known techniques, e.g., by molecular beam epitaxy.

In addition to the above referred to AlSbAs/InAs/GaSb structure a variety of other combinations of materials can be used in HETs according to the invention. Exemplary is a bipolar HET comprising an $AlAs_{0.44}Sb_{0.56}$ emitter, a $In_{0.53}Ga_{0.47}As$ base, and an InP collector.

Example I

Figure 4:
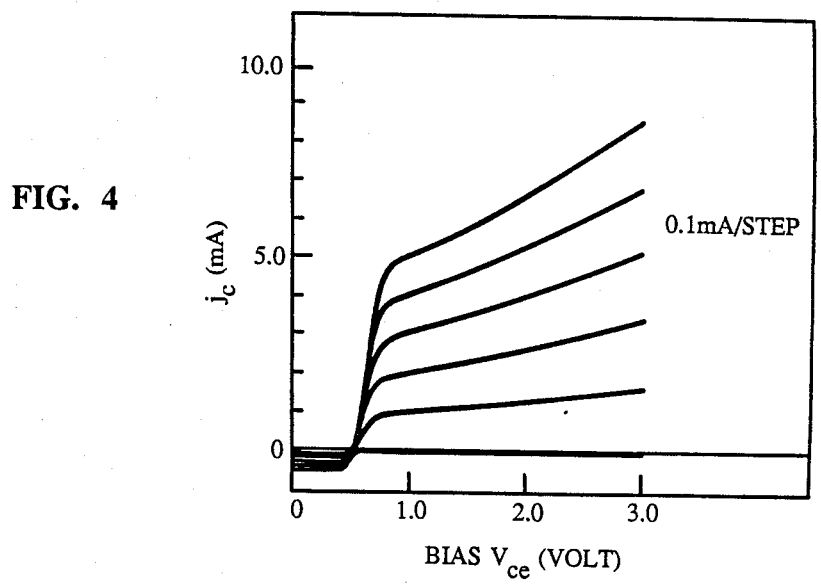
FIG. 4 gives room temperature current gain curves measured on an exemplary device according to the invention.

On a (001)-oriented Te-doped (n+) GaSb single crystal substrate was grown by MBE the following heteroepitaxial structure: a 800 nm thick n+Te-doped ($10^{18}$ cm$^{-3}$) GaSb buffer layer, followed by a 350 nm thick Te-doped ($10^{15}$ cm$^{-5}$) GaSb layer, the latter to become the collector depletion region. This was followed by a 10 nm thick modulation-doped InAs layer (to become the base layer), and a 150 nm thick Te-doped ($10^{16}$ cm$^{-3}$) $AlSb_{0.92}As_{0.08}$ layer (the latter to become the emitter layer). This in turn was followed by deposition of a 50 nm thick n+Te-doped ($10^{18}$ cm$^{-3}$) $AlSb_{0.92}As_{0.08}$ layer and of a 300 nm thick n+GaSb layer. After patterning the heterostructure (substantially in the manner shown in FIG. 1) by standard lithography and etching techniques, evaporated AuGeNi alloy contacts were made to the buffer layer, the base layer, and the uppermost layer, followed by rapid annealing to form ohmic contacts. Standard tests showed that the structure operated as a HET, with room temperature $\beta > 10$ for $V_{ce} \geq 1$ volt, as exemplified by the data presented in FIG. 4.

Example II

A heteroepitaxial structure is grown substantially as described in Example I, except that the substrate is Sn-doped n+ InP, the buffer layer is n+ Sn-doped ($10^{18}$ cm$^{-3}$) InP, the layer corresponding to the collector depletion region is 500 nm thick Sn-doped ($10^{17}$ cm$^{-3}$) InP, the layer corresponding to the base layer is a 20 nm thick Be-doped p+ ($2 \times 10^{19}$ cm$^{-3}$) $In_{0.53}Ga_{0.47}As$ layer. This layer is followed by a 150 nm thick Sn-doped n-type ($5 \times 10^{17}$ cm$^{-3}$) $AlAs_{0.44}Sb_{0.56}$ layer, and this is followed by a 300 nm thick n+$AlAs_{0.44}Sb_{0.56}$ layer. After patterning and contacting substantially as in Example I, standard tests show that the heterostructure performs as HET, with room temperature $\beta > 1000$ for $V_{ce} \geq 1$ volt.

Example III

A unipolar HET is produced substantially as described in Example I, except that the collector depletion region is 400 nm thick and consists of a superlattice (6 nm thick GaSb layers alternating with 1.5 nm thick $AlSb_{0.92}As_{0.08}$ layers), the base layer is 6 nm of InAs, and the emitter layer is 150 nm of $AlSb_{0.92}As_{0.08}$. The heterostructure functions as a HET, with room temperature $\beta$ substantially greater than 10 for $V_{ce} \geq 1$ volt. The presence of the superlattice results in improved transmission of the hot electrons through the base/emitter interface, due to improved velocity matching.

Example IV

A bipolar HET is produced substantially as described in Example II, except that the base layer has composition $In_{0.58}Ga_{0.42}As$. The resulting strained base layer leads to decreased scattering of the hot electrons in the base layer. The heterostructure is found to function as a HET, with room temperature $\beta$ substantially greater than 10 for $V_{ce} > 1$ volt.

What I claimed is:

1. A hot electron transistor comprising
   (a) an electron emission region (the first region), an electron collection region (the third region) and a second region intermediate the first and third regions, forming interfaces and being epitaxial therewith, the first, second, and third regions each consisting of compound semiconductor material, with the composition of the second region material differing at least from that of the first region material at the first/second region interface;
   (b) means for making electrical contact with the first, second, and third regions, respectively; and
   (c) means adapted for causing injection of hot electrons of average energy $E_i$ from the first into the second region, with at least some of the injected hot electrons crossing the interface between the second and third region, associated with the hot electrons being a momentum vector $k_i$ having components $k_{i,1}$ and $k_{i,2}$ that are, respectively, perpendicular and parallel to the interface between the first and second region, and a velocity component normal to the interface between the second and third regions;
   characterized in that the first, second, and third region materials are chosen such that in the second region material there are empty electron states at energies substantially equal to $E_i$, such that associated with the empty electron states is a wave vector component $k_{i,2}$ that is substantially equal to the corresponding wave vector component of at least some of the electrons of energy $E_i$ in the first region material, and such that the component of velocity of the hot electrons normal to the second/third region interface undergoes relatively small change upon crossing of the second/third region interface, whereby the transistor has a relatively high current gain.

2. The transistor of claim 1, wherein the first, second, and third region materials are chosen such that at least a substantial fraction of the hot electrons injected from the first region into the second region have in the second region a momentum such that the absolute value of $k_{i,2}/k_{i,1}$ is less than about 0.2.

3. The transistor of claim 2, wherein the component of velocity normal to the second/third region interface changes by most 20% upon crossing of the second/third region interface.

4. The transistor of claim 2, wherein the third region comprises a superlattice adapted for substantially matching the velocity component normal to the second/third region interface in the third region material adjacent to the interface to that in the second region material.

5. The transistor of claim 2, wherein the first, second, and third region materials are chosen such that the second region material is substantially strained such that scattering of the hot electrons in the second region material is reduced.

6. The transistor of claim 1, wherein the thickness of the second region is at most 20 nm.

7. The transistor of claim 6 comprising ambient charge carriers in the second region, further comprising means for reducing the effective dimensionality of the ambient charge carriers in the second region, such that scattering of the hot electrons in the second region is reduced.

8. The transistor of claim 2, wherein the first/second region interface is substantially normal to a (001) lattice direction, associated with the second region material are X-minima of the electronic bandstructure, with an energy being associated with the X-minima, and $E_i$ is selected to be less than the energy associated with the X-minima.

9. The transistor of claim 2, wherein the transistor is a bipolar transistor, associated with the second region being a heavy hole having effective mass $m_h^*$, the hot electrons having effective mass $m_e^*$ in the second region, and the second region material is chosen such that $m_h^*/m_e^*$ is greater than about 10 for the direction perpendicular to the second/third region interface.

10. The transistor of claim 1, wherein the first/second region interface is substantially normal to a (001) lattice direction, associated with at least the first region material at the first/second region interface being X-minima in the bandstructure, and associated with the second region material being a Γ-minimum in the bandstructure, with $E_i$ being such that electrons from at least one of the X-minima are injected into the Γ-minimum.

11. The transistor of claim 1, wherein the first, second, and third regions comprise material substantially of composition $AlSb_{0.92}As_{0.08}$, InAs, and GaSb, respectively.

12. The transistor of claim 1, wherein the first, second and third regions comprise material substantially of composition $AlAs_{0.44}Sb_{0.56}$, $In_{0.53}Ga_{0.47}As$, and InP, respectively.

13. The transistor of claim 1, wherein the first region comprises indirect, wide bandgap semiconductor material, and the hot electrons are injected into direct Γ-like states in the second region.

* * * * *